(12) United States Patent
Shioyama et al.

(10) Patent No.: US 6,185,146 B1
(45) Date of Patent: *Feb. 6, 2001

(54) SEMICONDUCTOR MEMORY DEVICE AND METHOD FOR PRODUCING THE SAME

(75) Inventors: Kazutomo Shioyama, Nara-ken; Hidekazu Takata, Nara, both of (JP)

(73) Assignee: Sharp Kabushiki Kaisha (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/056,282

(22) Filed: Apr. 7, 1998

(30) Foreign Application Priority Data

Apr. 11, 1997 (JP) .................................................. 9-094150

(51) Int. Cl.[7] ...................................................... G11C 8/00
(52) U.S. Cl. .................................. 365/230.03; 365/225.7
(58) Field of Search .............................. 365/225.7, 230.03

(56) References Cited

U.S. PATENT DOCUMENTS

| 4,677,742 | * | 7/1987 | Johnson ................................. 365/163 |
| 5,384,745 |   | 1/1995 | Konishi et al. .................... 365/230.03 |
| 5,387,311 | * | 2/1995 | Hall et al. ............................. 156/630 |
| 5,566,128 | * | 10/1996 | Magome ........................... 365/230.06 |

\* cited by examiner

*Primary Examiner*—David Nelms
*Assistant Examiner*—M. Tran
(74) *Attorney, Agent, or Firm*—Morrison & Foerster LLP

(57) ABSTRACT

A semiconductor memory device includes a plurality of memory arrays including a plurality of memory cells; a plurality of fuses having one of a disconnected state and a connected state for classifying the plurality of memory arrays into a plurality of banks; and a selection circuit for selecting one of the plurality of banks based on the state of the plurality of the fuses and an address signal.

3 Claims, 7 Drawing Sheets

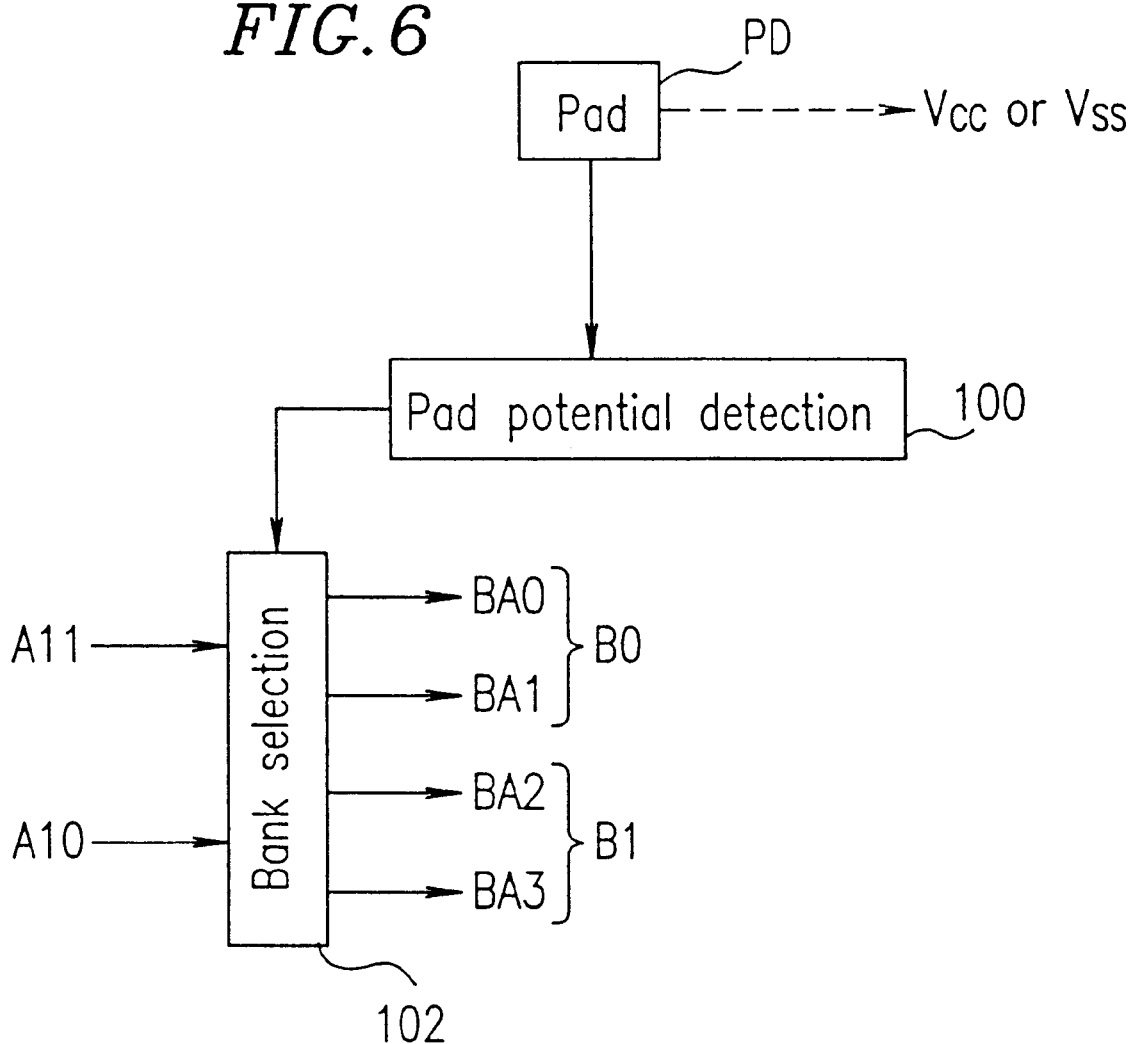

SEMICONDUCTOR MEMORY DEVICE AND METHOD FOR PRODUCING THE SAME

BACKGROUND OF THE INVENTION

1. Field of the Invention

The present invention relates to a semiconductor memory device for accessing a memory cell in a memory array belonging to one of a plurality of banks into which a plurality of memory arrays are classified, and a method for producing such a semiconductor memory device.

2. Description of the Related Art

A conventional semiconductor device is disclosed in, for example, Japanese Laid-Open Publication No. 6-76567. In the semiconductor memory device disclosed in the above-mentioned publication, memory arrays are classified into two or four banks in accordance with whether the data input and output is performed at a unit of 8 bits (×8 structure) or 4 bits (×4 structure).

The number of banks is determined in accordance with the number of a series of pieces of data wrap length accessible by one address input in lieu of being set in accordance with the number of bits included in one piece of data.

In a structure where the memory arrays are classified into a plurality of banks, data transfer rate is improved by performing an interleave operation, in which banks are accessed alternately.

FIG. 6 is a block diagram of a device for switching the number of banks, which is also disclosed in Japanese Laid-Open Publication No. 6-76567.

In FIG. 6, a pad PD is connected to a power supply potential Vcc or a ground potential Vss by wire bonding. A pad potential detection circuit 100 detects a potential of the pad PD and outputs a "high" signal (high level) or "low" signal (low level). In response to the potential of the signal sent from the pad potential detection circuit 100, a bank selection circuit 102 performs a 2-bit or 1-bit decoding operation, thereby generating a bank selection signal.

The bank selection circuit 102 receives two-bit selection address signals A11 and A10. When the output signal from the pad potential detection circuit 100 represents a ×4 structure, the bank selection circuit 102 decodes the two-bit signals A11 and A10, and one of four-bit bank selection signals BA0 through BA3 is set to a selecting state. In other words, the bank selection circuit 102 generates the four-bit bank selection signals BA0 through BA3 in order to set four banks. By the bank selection signals, the banks are sequentially selected and thus activated.

When the output signal from the pad potential detection circuit 100 represents a ×8 structure, the bank selection circuit 102 invalidates one of the two-bit address signals A10 and generates two-bit bank selection signals B0 and B1 in accordance with the other signal A11. In other words, the bank selection circuit 102 generates the two-bit bank selection signals B0 and B1 in order to set two banks. By the bank selection signals, the banks are sequentially selected and thus activated.

The system shown in FIG. 6 is applicable to a structure in which the number of banks is determined in accordance with the wrap length. In such a structure, the pad PD is connected to the power supply potential Vcc or the ground potential Vss depending on whether the wrap length is 8 or 4. The pad potential detection circuit 100 is used as a wrap length setting circuit, and the bank selection circuit 102 generates a bank selection signal.

However, in the above-described structure, the potential of the pad PD is determined by wire bonding, which determines the number of the banks. Accordingly, as the number of banks to be set increases, the number of required pads also increases. For example, when the number of banks is set to be 2, only one pad is required. When the number of banks is set to be four, two pads are required.

In this manner, the number of required pads increases along with the number of banks to be set, which results in an increase in the chip area required for the pads.

SUMMARY OF THE INVENTION

According to one aspect of the invention, a semiconductor memory device includes a plurality of memory arrays including a plurality of memory cells; a plurality of fuses having one of a disconnected state and a connected state for classifying the plurality of memory arrays into a plurality of banks; and a selection circuit for selecting one of the plurality of banks based on the state of the plurality of the fuses and an address signal.

According to another aspect of the invention, a method for producing a semiconductor memory device includes the steps of forming a plurality of memory arrays including a plurality of memory cells; and forming a fuse having one of a disconnected state and a connected state for classifying the plurality of memory arrays into a plurality of banks, the fuse being formed by masking.

According to the present invention, a plurality of memory arrays are classified into a prescribed number of (two or more) banks by selectively disconnecting fuses. When address signals are partially or totally input to the semiconductor memory device according to the present invention in the state where the fuses are selectively disconnected, one of the banks is selected based on an input signal. The state where the fuses are selectively disconnected includes the state where no fuse is disconnected.

The fuses are formed together with other circuits of the semiconductor memory device. Since a fuse is smaller than a pad, the semiconductor memory device according to the present invention reduces the chip area compared to the conventional semiconductor memory device using a pad.

Thus, the invention described herein makes possible the advantages of providing a semiconductor memory device which does not require the chip area to be increased even when the number of banks increases, and a method for producing such a semiconductor memory device.

This and other advantages of the present invention will become apparent to those skilled in the art upon reading and understanding the following detailed description with reference to the accompanying figures.

BRIEF DESCRIPTION OF THE DRAWINGS

FIG. 6 is a block diagram of a conventional device for switching the number of banks;

DESCRIPTION OF THE PREFERRED EMBODIMENTS

Hereinafter, the present invention will be described by way of illustrative examples with reference to the accompanying drawings.

With reference to FIGS. 1, 2B, 3, 4, 5A and 5B a semiconductor memory device in one example according to the present invention will be described.

Figure 1:
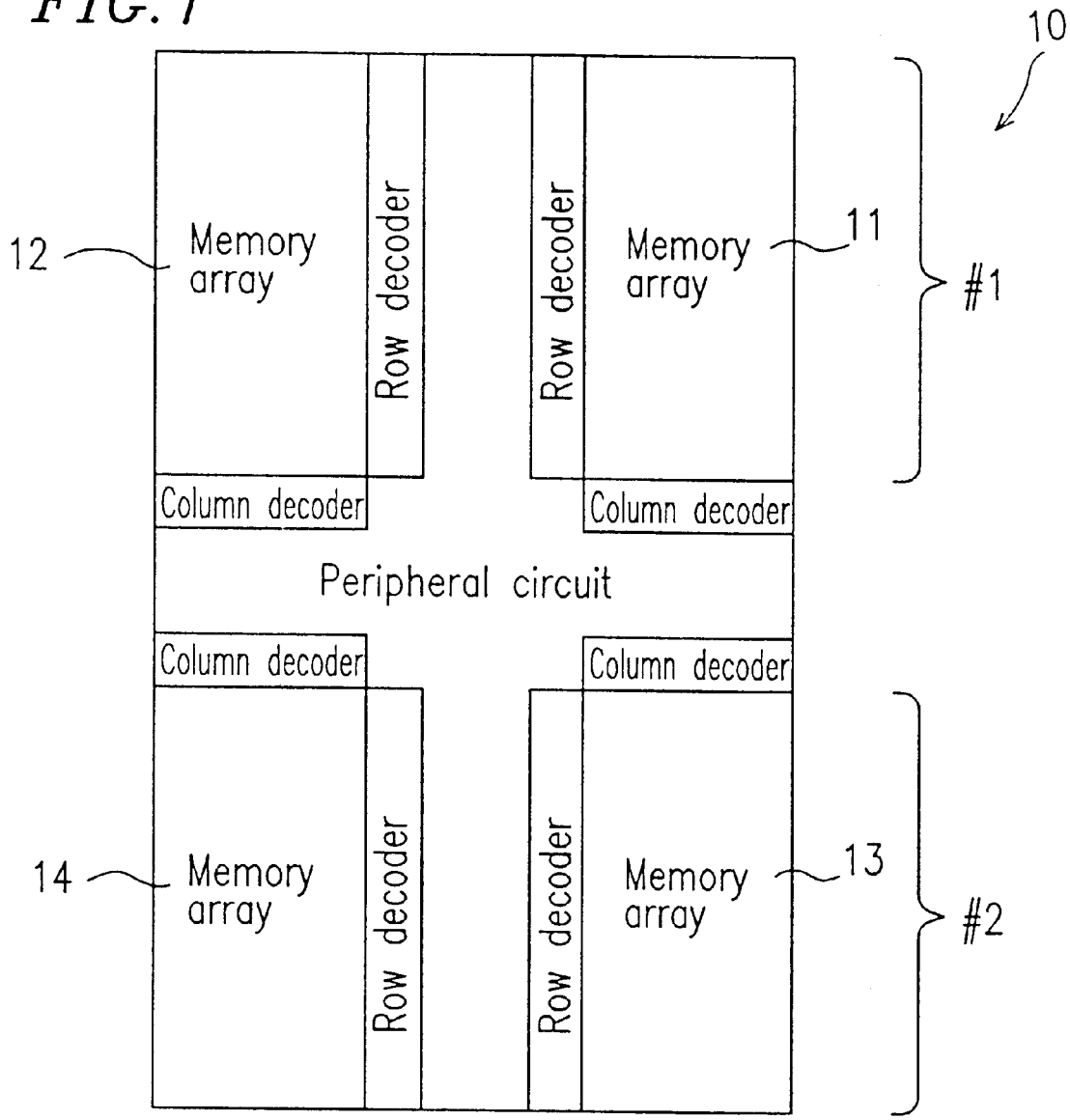
FIG. 1 is a schematic diagram showing a circuit arrangement of a semiconductor memory device in one example according to the present invention.

FIG. 1 is a schematic diagram showing a circuit arrangement of a semiconductor memory device 10. The semiconductor memory device 10 is, for example, a 16-megabit synchronous DRAM. The semiconductor memory device 10 includes first through fourth memory arrays 11 through 14, row decoders and column decoders respectively corresponding to the first through fourth memory arrays 11 through 14, and a peripheral circuit. The plurality of memory arrays each include a plurality of memory cells for storing information. For example, the information have a value of "0" or "1". Each memory cell can be accessed by the semiconductor memory device 10.

The semiconductor memory device 10 has a memory capacity of 1 mega word ×16 bits. The first through fourth memory arrays 11 through 14 each have a memory capacity of 4 megabits. The first through fourth memory arrays 11 through 14 can be classified into two, four, or eight banks.

For example, in the case where the first through fourth memory arrays are classified into two banks, the first and second memory arrays 11 and 12 are included in a first bank #1, and the third and fourth memory arrays 13 and 14 are included in a second bank #2.

In the case where the addresses are sequentially allocated, the data transfer rate is increased by accessing the first and second banks #1 and #2 alternately in, for example, the following manner.

While the first bank #1 is being activated (i.e., while the data is being written into or read from the memory cell), the state of the second bank #2 is changed from a pre-charge state (i.e., the state where a row is selected) into an activated state. While the state of the first bank #1 is being changed from the pre-charge state into the activated state, the second bank #2 is activated.

By performing data write/read for the first and second banks #1 and #2 alternately, the data transfer rate is enhanced. The above-described method is referred to as "interleave".

In the case where the first through fourth memory arrays 11 through 14 are classified into four banks, the data transfer rate is also enhanced by sequentially transitioning the state of the banks from the pre-charge state to the activated state in a similar manner.

In the case where the first through fourth memory arrays 11 through 14 are classified into eight banks, the data transfer rate is also enhanced by sequentially transitioning the state of the banks from the pre-charge state to the activated state in a similar manner. In this case, each of the first through fourth memory arrays 11 through 14 is divided into upper and lower portions, and each of the row decoders corresponding to the first through fourth memory arrays 11 through 14 is divided into upper and lower row decoders which are independently active. For example, the upper row decoder corresponding to the first memory array 11 can address a memory cell(s) in the upper portion of the first memory array 11 based on an address, then the lower row decoder corresponding to the first memory array 11 can address a memory cell(s) in the lower portion of the first memory array 11 based on another address.

Figure 2A:
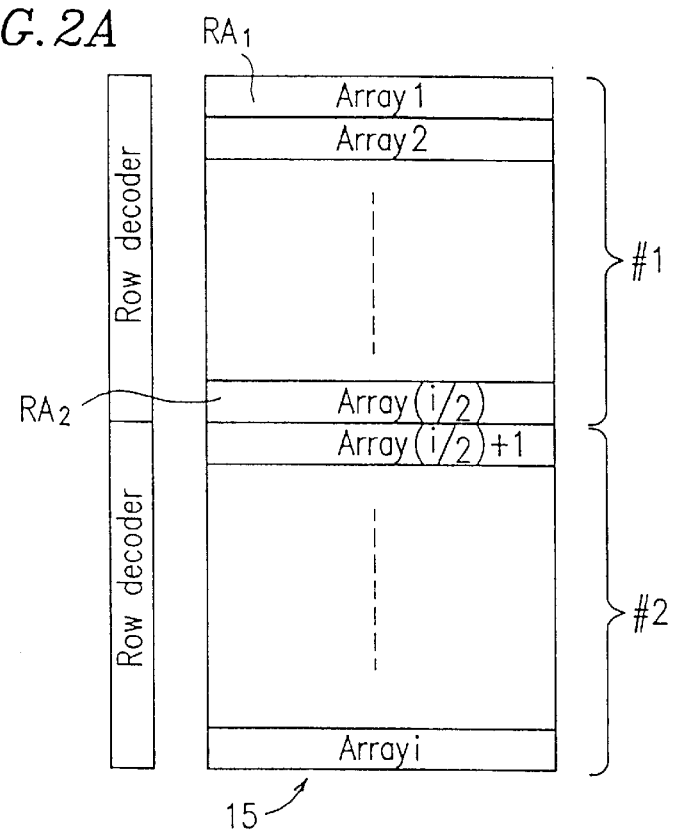
FIG. 2A shows a structure of a memory array group in which an interleave function cannot be used.

FIG. 2A is a structural view of a memory array group 15 including a plurality of memory arrays. The memory arrays included in the memory array group 15 are classified into a first bank #1 including memory arrays 1 through (i/2) and a second bank #2 including memory arrays (i/2)+1 through i.

In such a structure, in the case where allocated row addresses RA1 and RA2 are both in the first bank #1, the interleave function cannot be used even when the row addresses RA1 and RA2 are sequentially accessed. In other words, since the state of the row address RA1 is first transitioned from the pre-charge state to the activated state and then the state of the row address RA2 is transitioned from the pre-charge state to the activated state, the data transfer rate cannot be improved.

Figure 2B:
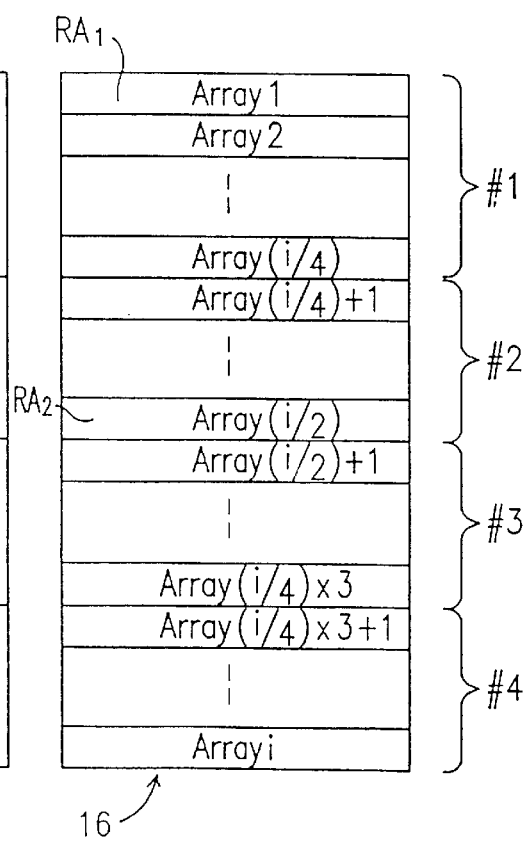
FIG. 2B shows a structure of a memory array group in which an interleave function can be used.

FIG. 2B is a structural view of a memory array group 16 according to the present invention. The memory arrays included in the memory array group 16 are classified into a first bank #1 including memory arrays 1 through (i/4), a second bank #2 including memory arrays (i/4)+1 through i/2, a third bank #3 including memory arrays (i/2)+1 through (i/4)×3, and a fourth bank #4 including memory arrays (i/4)×3+1 through i.

In such a structure, the row addresses RA1 and RA2 can be respectively allocated to the first bank #1 and the second bank #2. Accordingly, the data transfer rate is sufficiently improved by performing the interleave operation, i.e., activating a row in one bank while changing the state of a row in another bank from the pre-charge state to the activated state.

Figure 3:
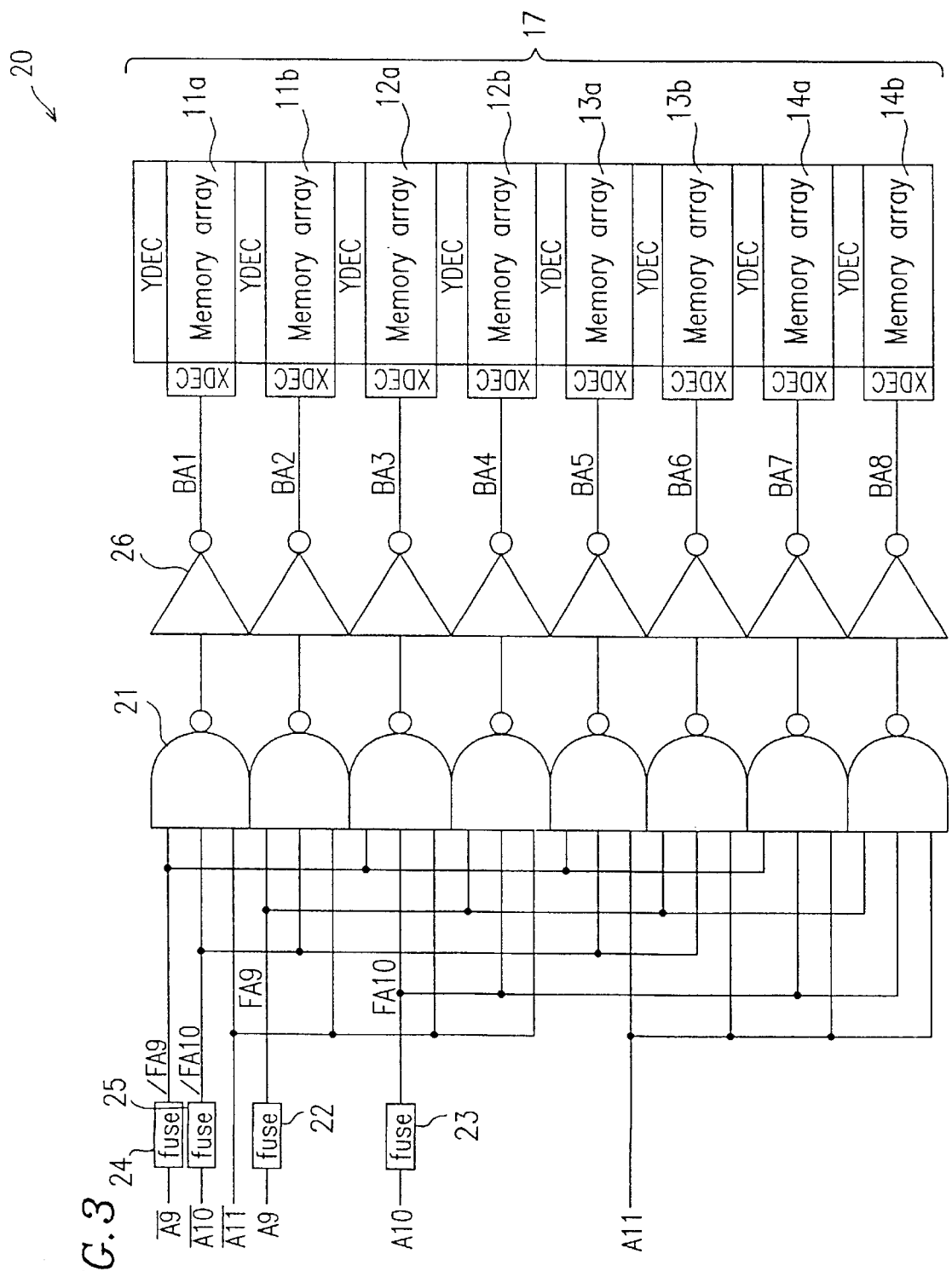
FIG. 3 is a detailed circuit diagram of a semiconductor memory device according to the present invention.

FIG. 3 is a detailed circuit diagram of a semiconductor memory device 20 according to the present invention. The semiconductor memory device 20 includes a memory array group 17, a 3-input NAND circuit group 21, fuse circuits 22 through 25, and an inverter group 26.

A plurality of memory arrays included in the memory array group 17 can be classified into two, four or eight banks. In this example, the memory array group 17 includes eight memory arrays 11a, 11b, 12a, 12b, 13a, 13b, 14a and 14b for simplicity.

The semiconductor memory device 20 receives 3-bit address signals A9, A10 and A11 and corresponding inverted address signals /A9, /A10 and /A11.

One of the 3-bit address signals, for example, the signal A11 is directly input to the 3-input NAND circuit group 21, and one of the inverted address signals, for example, the signal /A11 is also directly input to the 3-input NAND circuit group 21. The other two signals A9 and A10 are input to the 3-input NAND circuit group 21 via fuse circuits 22 and 23, respectively. The other two inverted signals /A9 and /A10 are input to the 3-input NAND circuit group 21 via fuse circuits 24 and 25, respectively. The output signals from the 3-input NAND circuit group 21 are inverted by the inverter group 26 and output as bank selection signals BA1 through BA8. The bank selection signals BA1 through BA8 are input to the memory array group 17.

When the fuse circuits 22, 23, 24 and 25 are all in a connected state, the address signals A9, /A10 and A11, and the inverted address signals /A9, /A10 and /A11 are all input to the 3-input NAND circuit group 21. Accordingly, one of the bank selection signals BA1 through BA8 which are output from the inverter group 26 selectively becomes "high". Thus, one of the memory arrays 11a, 11b, 12a, 12b, 13a, 13b, 14a and 14b is selected. In other words, the memory arrays 11a, 11b, 12a, 12b, 13a, 13b, 14a and 14b are classified into first through eight banks #1 through #8, and one of the banks #1 through #8 is selected.

When the fuse circuits 23 and 25 are in a connected state and fuses 22 and 24 are in a disconnected state, the address signal A9 and the inverted address signal /A9 are fixed "high". In this case, the fixed high-level signals, the address signals A10 and A11, and the inverted signals /A10 and /A11 are input to the 3-input NAND circuit group 21. Accordingly, two of the bank selection signals BA1 through BA8 selectively become "high". Thus, two of the memory arrays 11a, 11b, 12a, 12b, 13a, 13b, 14a and 14b are selected. In other words, the memory arrays 11a, 11b, 12a, 12b, 13a, 13b, 14a and 14b are classified into first through four banks #1 through #4, and one of the banks #1 through #4 is selected.

When the fuse circuits 22, 23, 24 and 25 are all disconnected state, the address signals A9 and A10, and the inverted address signal /A9 and /A10 are fixed "high". In this case, the fixed high-level signals, the address signal A11, and the inverted signal /A11 are input to the 3-input NAND circuit group 21. Accordingly, four of the bank selection signals BA1 through BA8 selectively become "high". Thus, four of the memory arrays 11a, 11b, 12a, 12b, 13a, 13b, 14a and 14b are selected. In other words, the memory arrays 11a, 11b, 12a, 12b, 13a, 13b, 14a and 14b are classified into first and second banks #1 and #2, and one of the banks #1 and #2 is selected.

The fuse circuit vs. bank relationship is shown in Table 1.

TABLE 1

| Number of banks | Fuse circuit 22, 24 | Fuse circuit 23, 25 | FA9 | FA10 | /FA9 | /FA10 |
| --- | --- | --- | --- | --- | --- | --- |
| 8 | Connected state | Connected state | A9 | A10 | /A9 | /A10 |
| 4 | Disconnected state | Connected state | "1" | A10 | "1" | /A10 |
| 2 | Disconnected state | Disconnected state | "1" | "1" | "1" | "1" |

As shown in FIG. 3, the memory array group 17 includes a plurality of row decoders and a plurality of column decoders in correspondence with the banks.

Accordingly, each of the banks is individually accessed by a bank selection signal from the inverter group 26, an address signal allocating the row and column of a memory cell in the memory array, and a control signal from the peripheral circuit.

The bank selection signal from the inverter group 26 in FIG. 3 selects one of the plurality of banks including a memory array to be put into the pre-charge state. For example, in the case where the memory arrays 11a, 11b, 12a, 12b, 13a, 13b, 14a and 14b are classified into the first through eighth banks #1 through #8, one of the banks #1 through #8 is selected. The memory array in the selected bank is placed in the pre-charge state and then placed in the activated state. Immediately after the data read/write for one bank is completed, the data read/write for another bank is started. Thus, an inter leave operation is performed.

Similarly, in the case where the memory arrays 11a, 11b, 12a, 12b, 13a, 13b, 14a and 14b are classified into four or two banks, one of the banks is selected. The memory array in the selected bank is placed in the pre-charge state and then placed in the activated state. Immediately after the data read/write for one bank is completed, the data read/write for another bank is started.

Figure 4:
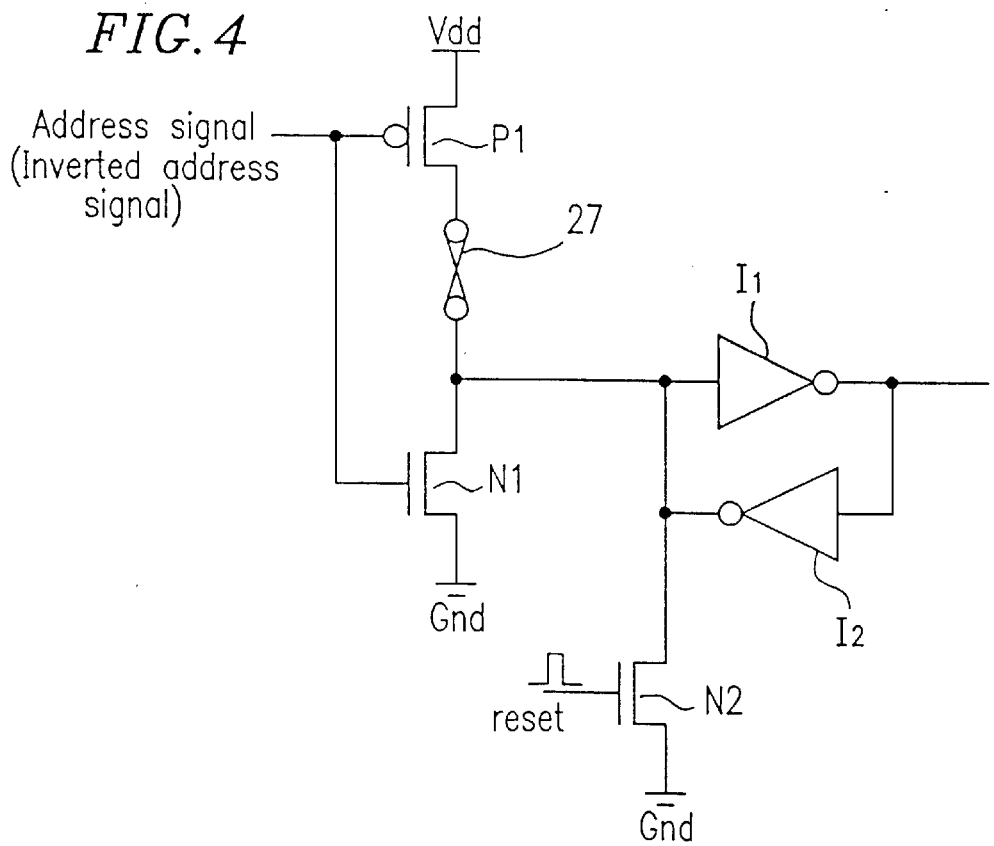
FIG. 4 is a circuit diagram which is common to fuse circuits shown in FIG. 3.

FIG. 4 is a circuit diagram which is common to the fuse circuits 22, 23, 24 and 25 shown in FIG. 3. The fuse circuits 22, 23, 24 and 25 each have a p-channel transistor P1, n-channel transistors N1 and N2, a fuse 27, and inverters I1 and I2.

The fuse circuits 22, 23, 24 and 25 each receive a n address signal (or an inverted address signal). The address signal (or the inverted address signal) is inverted by inverters including the p-channel transistor P1 and the n-channel transistor N1 and further inverted by the inverter I1. When the fuse 27 is connected, the level of the signal which is input to the fuse circuit is equal to the level of the signal which is output from the fuse circuit.

When the fuse 27 is disconnected, regardless of whether the n-channel transistor N1 is turned on or off in accordance with the address signal (or the inverted address signal), the level of the signal which is output from the inverter I1 is fixed "high". The reason is that the level of the input to the inverter I1 is set "low" due to a reset signal sent to the n-channel transistor N2.

Accordingly, when the fuse 27 is disconnected, the level of the signals output from the fuse circuits 22, 23, 24 and 25 are fixed "high".

The fuse circuits 22, 23, 24 and 25 are produced in the production process of the semiconductor memory device 20, and the fuses 27 in the fuse circuits 22, 23, 24 and 25 are selectively connected or disconnected.

As described above, the memory arrays included in the memory array group 17 can be classified into two, four or eight banks. The fuse circuits can be incorporated as a part of the circuit. Therefore, the semiconductor memory device according to the present invention requires a smaller chip area compared to the conventional semiconductor memory device using pads which are set to the power supply potential or the ground potential by wire bonding.

Figure 5A:
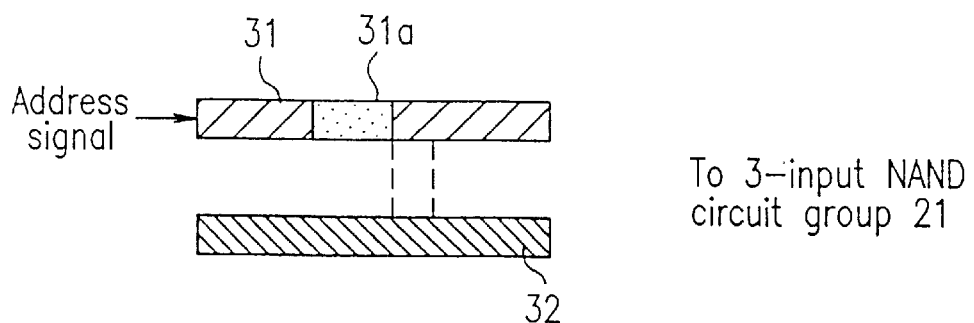
FIGS. 5A and 5B show alternative structures of the fuse circuits.
Figure 5B:
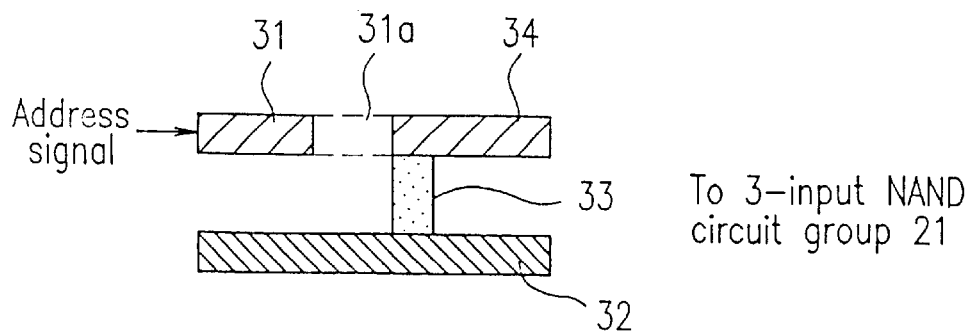

FIGS. 5A and 5B show alternative structures of fuse circuits according to the present invention. FIG. 5A shows a fuse circuit which is connected, and FIG. 5B shows a fuse circuit which is disconnected.

In FIG. 5A, a signal line 31 is provided parallel to a power supply line 32. An address signal (or an inverted address signal) is input to the 3-input NAND circuit group 21 (FIG. 3) via the signal line 31.

In FIG. 5B, the signal line 31 is provided parallel to the power supply line 32, except that the signal line 31 is cut at a portion 31a and a part 34 of the signal line 31 is connected to the power supply line 32 via a shortcircuiting line 33. The part 34 is closer to the 3-input NAND circuit group 21 than the rest of the signal line 31. Accordingly, an address signal (or an inverted address signal) is blocked at the portion 31a, and a voltage of the power supply line 32 is applied to the part 34 of the signal line 31. The power supply line 32 can be replaced by a signal line which is set "high".

Figure 7:
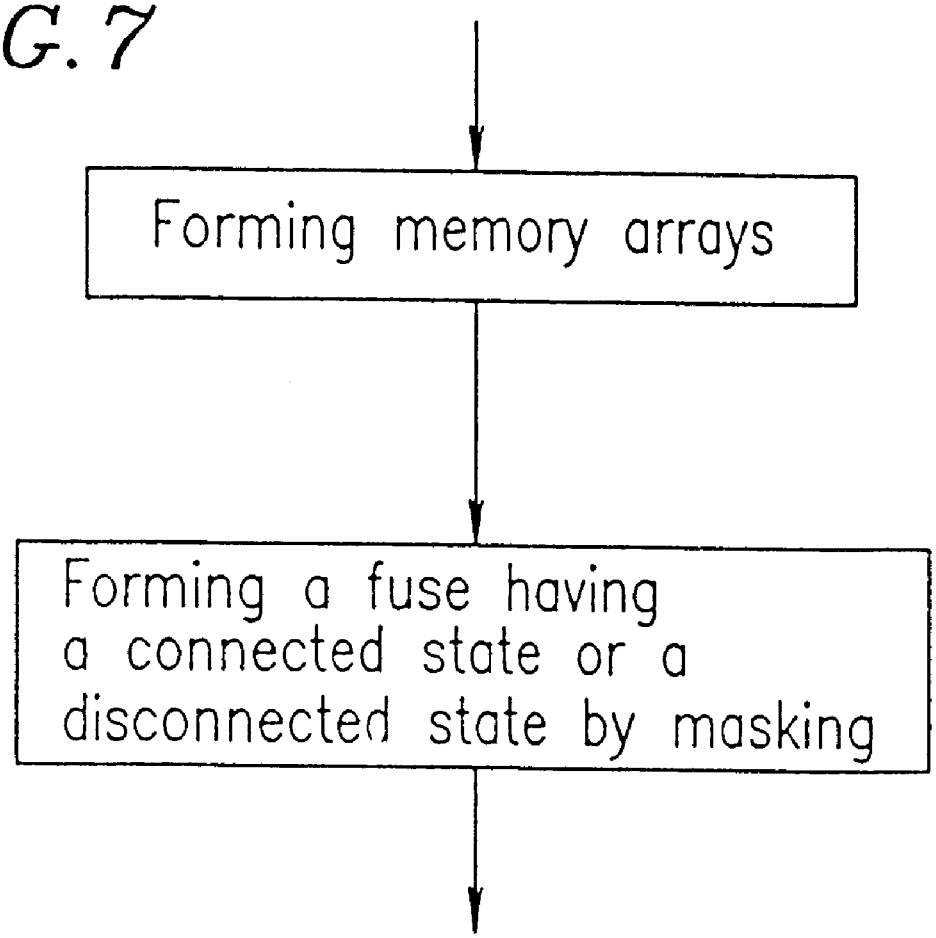
FIG. 7 is a flow diagram for producing a semiconductor memory device according to the present invention.
Figure 8A:
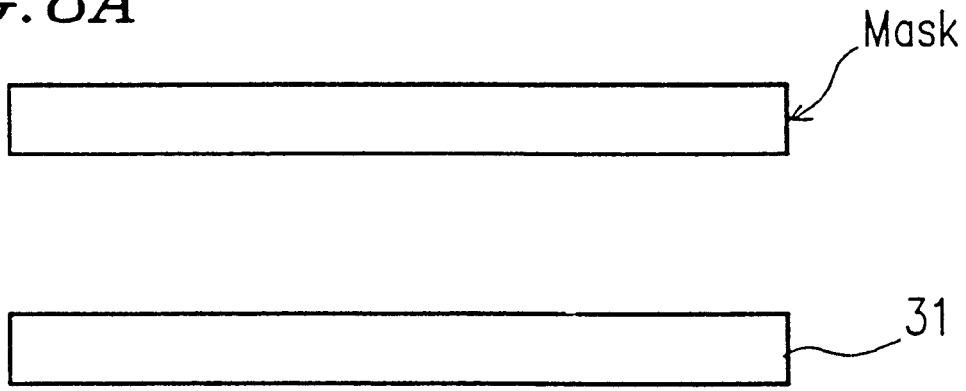
FIG. 8A is a side view illustrating a masking process for forming the fuse circuit shown in FIG. 5A.
Figure 8B:
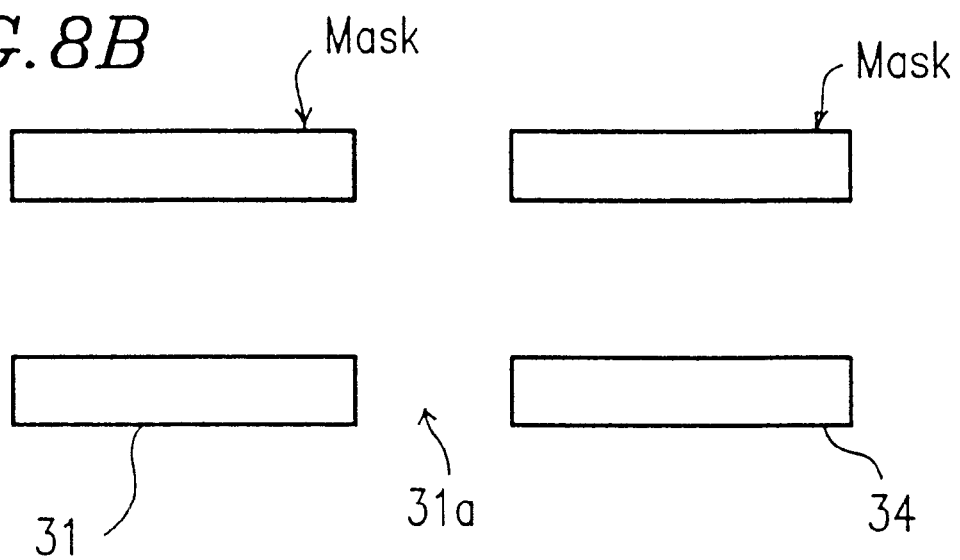
FIG. 8B is a side view illustrating a masking process for forming the fuse circuit shown in FIG. 5B.

The signal line 31, the power supply line 32 and the shortcircuiting line 33 can be relatively easily formed in the production process of the semiconductor memory device by patterning through masking as illustrated in FIGS. 7, 8A and 8B. FIG. 7 is a flow diagram illustrating a method for producing a semiconductor memory device according to the present invention.

FIG. 8A shows a masking process for forming the fuse circuit shown in FIG. 5A. Although FIG. 8A shows only a mask for forming the signal line 31, the power supply line 32 is formed using a similar mask. FIG. 8B shows a masking process for forming the fuse circuit shown in FIG. 5B. Although FIG. 8B shows only masks for forming the signal line 31 including the part 34, the power supply line 32 and the shortcircuiting line 33 are formed using a similar mask.

According to the present invention, a plurality of fuse circuits are selectively disconnected, and thus a plurality of memory arrays are classified into a prescribed number of banks. By allocating an address in such a structure, one of the banks is selected in accordance with the address. The fuse circuits can be produced together with other circuits of the semiconductor memory device. Therefore, the semiconductor memory device according to the present invention requires a smaller area than the conventional semiconductor memory device in which memory arrays are classified into banks using pads.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semi-conductor memory device provided with a plurality of memory arrays each having a plurality of memory cells, the plurality of memory arrays being divided into a plurality of banks, each including at least two memory arrays, wherein memory cells at every one of the banks are accessible, the semiconductor memory device comprising:

setting means of bank numbers including a plurality of fuses wherein any one of respective numbers of the banks is selected according to combination of connection and disconnection of at least two of the fuses, and the memory arrays are divided at the respective selected number of banks, and control means for selecting in response to an address signal of data being input, any one of the respective banks having been divided by said setting means of bank numbers.

2. The semiconductor memory device of claim 1, wherein said fuses are formed by masking.

3. A method for producing a semiconductor memory device, comprising the steps of:

forming a plurality of memory arrays including a plurality of memory cells; and forming a fuse having one of a disconnected state and a connected state for classifying the plurality of memory arrays into a plurality of banks, the fuse being formed by masking.

* * * * *